(12) United States Patent
Ohno

(10) Patent No.: US 6,433,377 B1
(45) Date of Patent: Aug. 13, 2002

(54) CHAIN RAM AND METHOD FOR FABRICATING THE SAME

(75) Inventor: Morifumi Ohno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/947,611

(22) Filed: Sep. 7, 2001

(51) Int. Cl.[7] ............... H01L 29/76; H01L 29/94; H01L 31/062; H01L 31/113; H01L 31/119

(52) U.S. Cl. ............... 257/295; 257/296; 257/307; 257/310; 257/532

(58) Field of Search ................ 257/295, 296, 257/310, 532

(56) References Cited

U.S. PATENT DOCUMENTS 5,206,788 A * 4/1993 Larson et al. ............... 361/313
6,288,931 B1 * 9/2001 Kye et al. ................... 365/145

FOREIGN PATENT DOCUMENTS

JP      11-008354      1/1999

OTHER PUBLICATIONS

High–Density Chain Ferroelectric Random Access memory (Chain FRAM) Takashima et al., IEEE Journal of Solid–State Circuits, vol. 33, No. 5, May 1998.

* cited by examiner

*Primary Examiner*—Eddie Lee
*Assistant Examiner*—Jesse A. Fenty
(74) *Attorney, Agent, or Firm*—Venable; Robert J. Frank

(57) ABSTRACT

A chain ferroelectric RAM includes a memory cell array having a plurality of memory cell, which connected in series between bit line and a plate line. Each memory cell includes a first ferroelectric capacitor having upper and lower electrodes between which a ferroelectric layer is provided; a second ferroelectric capacitor having upper and lower electrodes between which a ferroelectric layer is provided; and a transistor connected to the upper and lower electrodes of the first and second ferroelectric capacitors. The upper electrode of the first ferroelectric capacitor is connected to the lower electrode of the second ferroelectric capacitor, and the lower electrode of the first ferroelectric capacitor is connected to the upper electrode of the second ferroelectric capacitor in a complimentary manner.

10 Claims, 10 Drawing Sheets

CHAIN RAM AND METHOD FOR FABRICATING THE SAME

TECHNICAL FIELD OF THE INVENTION

The present invention generally relates to a chain RAM (Random Access Memory) and a method for fabricating thereof. More particularly, the present invention relates to a chain RAM using ferroelectric capacitors or high-κ capacitors.

BACKGROUND OF THE INVENTION

There has been a ferroelectric RAM (Random Access Memory) having a ferroelectric capacitor as a memory node or storing node. In a ferroelectric capacitor, electrolytic polarization is produced in crystal grains of a crystal structure oxide layer, included in a ferroelectric layer, when a voltage is applied to the capacitor. This voltage-electrolytic polarization characteristic has hysteresis. In a FeRAM, data of "1" or "0" are written and read using such hysteresis.

A conventional ferroelectric memory cell includes a FET (Field Effect Transistor) and a ferroelectric capacitor. The FET is connected at a gate to a word line WL. One of source and drain of the FET is connected to a bit line BL and at the other to an electrode of the ferroelectric capacitor. The ferroelectric capacitor is connected at the other electrode to a plate line PL.

A ferroelectric RAM (FRAM) has excellent characteristic of high speed read and write operations at a lower voltage. Such a FRAM includes a plurality of memory cell each having one transistor and one ferroelectric capacitor. The ferroelectric capacitor and transistor are connected in parallel, and the memory cells are connected in serial.

However, according to the above-described conventional chain FRAM, a voltage signal is applied to a selected memory cell through non-selected memory cells, therefore, voltage waveform at the electrodes of the ferroelectric capacitor for the selected memory cell is not stable. In other words, voltage waveform applied to the selected memory cell varies depending on its connected location in the FRAM. As a result, it is difficult to provide stable operation with the conventional chain FRAM.

OBJECTS OF THE INVENTION

Accordingly, an object of the present invention is to provide a chain FRAM having ferroelectric capacitors with symmetric characteristic so that the FRAM operates stably.

Another object of the present invention is to provide a ferroelectric capacitor with symmetric characteristic.

The objects and advantages of the invention may be realized and attained by means of the instrumentalities and combinations particularly pointed out in the appended claims.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a chain ferroelectric RAM includes a memory cell array having a plurality of memory cells connected in series between a bit line and a plate line. Each memory cell includes a first ferroelectric capacitor having upper and lower electrodes between which a ferroelectric layer is provided; a second ferroelectric capacitor having upper and lower electrodes, between which a ferroelectric layer is provided; and a transistor connected to the upper and lower electrodes of the first and second ferroelectric capacitors. The upper electrode of the first ferroelectric capacitor is connected to the lower electrode of the second ferroelectric capacitor, and the lower electrode of the first ferroelectric capacitor is connected to the upper electrode of the second ferroelectric capacitor in a complimentary manner.

According to a second aspect of the present invention, a method includes the steps of providing a semiconductor substrate; providing an insulating layer on the semiconductor substrate; providing lower electrodes of first and second ferroelectric capacitors on the insulating layer; providing ferroelectric layers on the lower electrodes of the first and second ferroelectric capacitors; providing upper electrodes on the ferroelectric layers of the first and second ferroelectric capacitors; connecting the lower electrode of the first ferroelectric capacitor to the upper electrode of the second ferroelectric capacitor, and connecting the upper electrode of the first ferroelectric capacitor to the lower electrode of the second ferroelectric capacitor in a complimentary manner.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
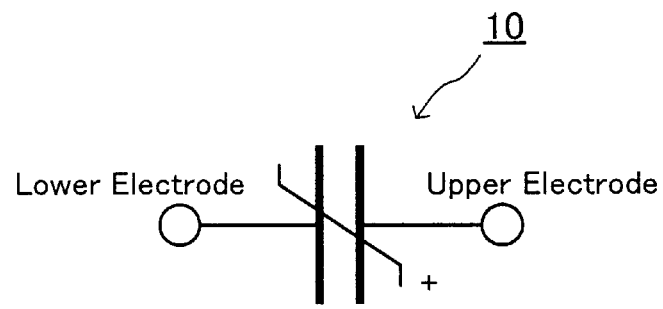
FIG. 1 is a circuit diagram illustrating a conventional ferroelectric capacitor.
Figure 2:
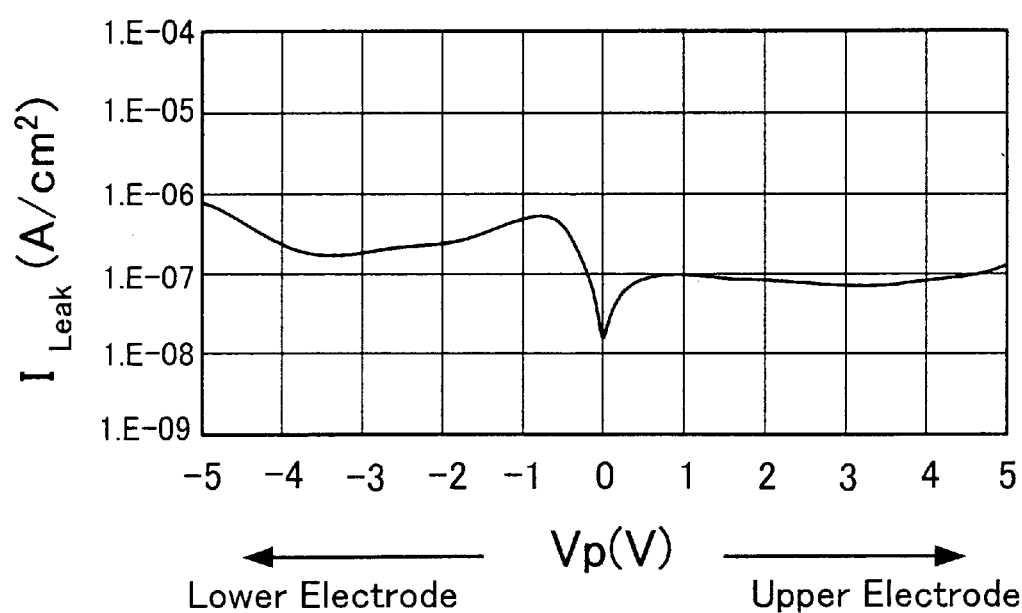
FIG. 2 is a graph showing a characteristic of the conventional ferroelectric capacitor.

For better understanding of the present invention, a conventional technology is first described in conjunction with FIGS. 1 and 2.

A conventional ferroelectric memory cell includes a FET (Field Effect Transistor), not shown, and a ferroelectric capacitor 10, shown in FIG. 1. The FET is connected at a gate to a word line WL. One of source and drain of the FET is connected to a bit line BL and at the other to an electrode of the ferroelectric capacitor 10. The ferroelectric capacitor 10 is connected at the other electrode to a plate line PL.

A ferroelectric RAM (FRAM) has excellent characteristic of high speed read and write operations at a lower voltage. Such a FRAM includes a plurality of memory cell each having one transistor and one ferroelectric capacitor. The ferroelectric capacitor and transistor are connected in parallel, and the memory cells are connected in serial.

However, according to the above-described conventional chain FRAM, a voltage signal is applied to a selected memory cell through non-selected memory cells, therefore, voltage waveform at the electrodes of the ferroelectric capacitor for the selected memory cell is not stable. In other words, voltage waveform applied to the selected memory cell varies depending on its connected location in the FRAM. As a result, it is difficult to provide stable operation with the conventional chain FRAM.

Figure 3:
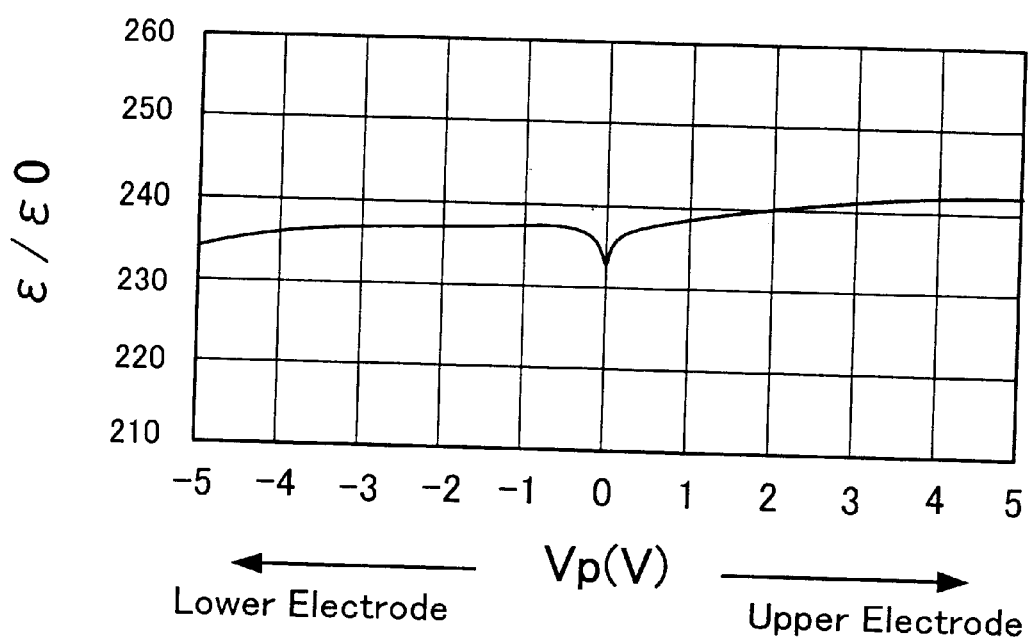
FIG. 3 is a graph showing another characteristic of the conventional ferroelectric capacitor.

As shown in FIGS. 2 and 3, according to the conventional ferroelectric capacitor 10, leak current characteristic and paraelectrics characteristic for MIM and MFM types of capacitors are asymmetrical. Such asymmetry is usually caused by its structure and fabrication process. Generally, a MFM (Metal-Ferroelectric-Metal) structure of capacitor has a MIM structure. Well know ferroelectric material, such as PZT and SBT, has a single crystal structure of metallic oxide. In fabrication process, a heating process is carried out to form a ferroelectric layer on a lower electrode layer, and then an upper electrode layer is formed on the ferroelectric layer. At MIM interface between metal layer and ferroelectric layer, fabrication asymmetry may be generated.

Figure 4:
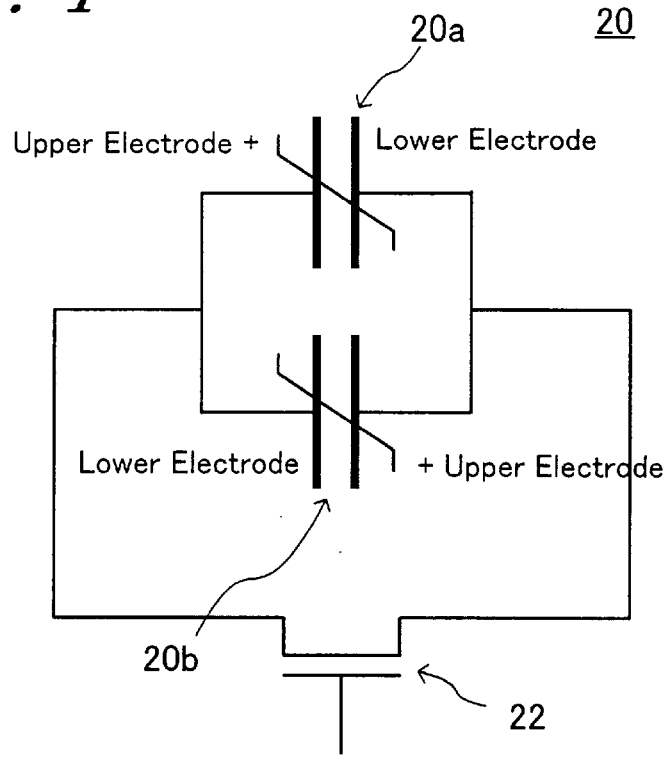
FIG. 4 is a circuit diagram illustrating a memory cell according to a first preferred embodiment of the present invention.

FIG. 4 is a circuit diagram illustrating a memory cell 20 according to a first preferred embodiment of the present invention. The memory cell 20 includes a first ferroelectric capacitor 20a, a second ferroelectric capacitor 20b and a FET (Field Effect Transistor) 22. The first ferroelectric capacitor 20a is connected at upper and lower electrodes to lower and upper electrodes of the second ferroelectric capacitor 20b, respectively, in a complimentary manner. One of source and drain of the FET 22 is connected to the upper electrode of the first ferroelectric capacitor 20a and to the lower electrode of the second ferroelectric capacitor 20b. The other of source and drain of the FET 22 is connected to the lower electrode of the first ferroelectric capacitor 20a and to the upper electrode of the second ferroelectric capacitor 20b.

In the first preferred embodiment, the first and second ferroelectric capacitors 20a and 20b are connected parallel relative to the FET 22. Both of the first and second ferroelectric capacitors 20a and 20b have MFM structure. The first and second ferroelectric capacitors 20a and 20b may use PZT and SBT as a ferroelectric layer, provided between metal layers (electrodes).

Figure 5:
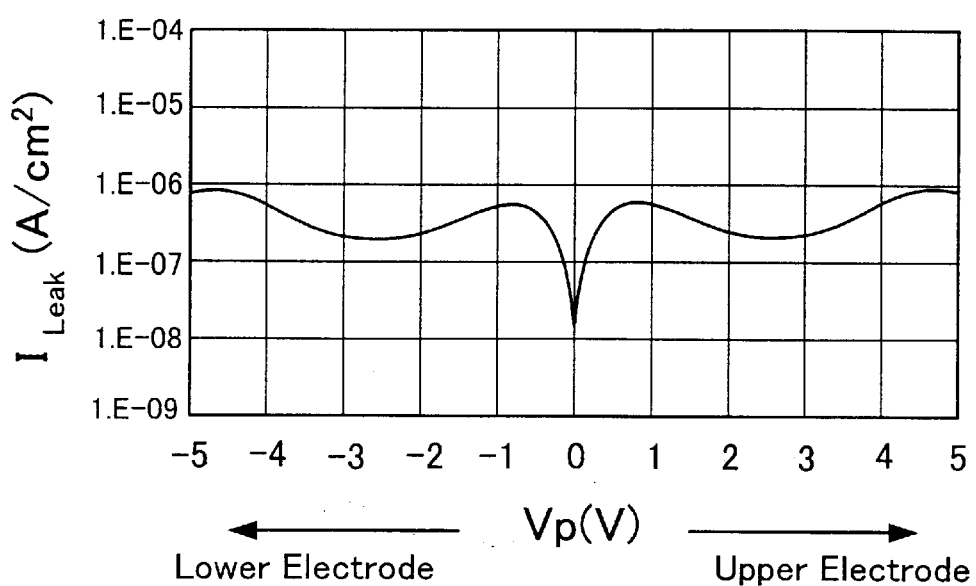
FIG. 5 is a graph showing a characteristic of the memory cell of the first preferred embodiment.
Figure 6:
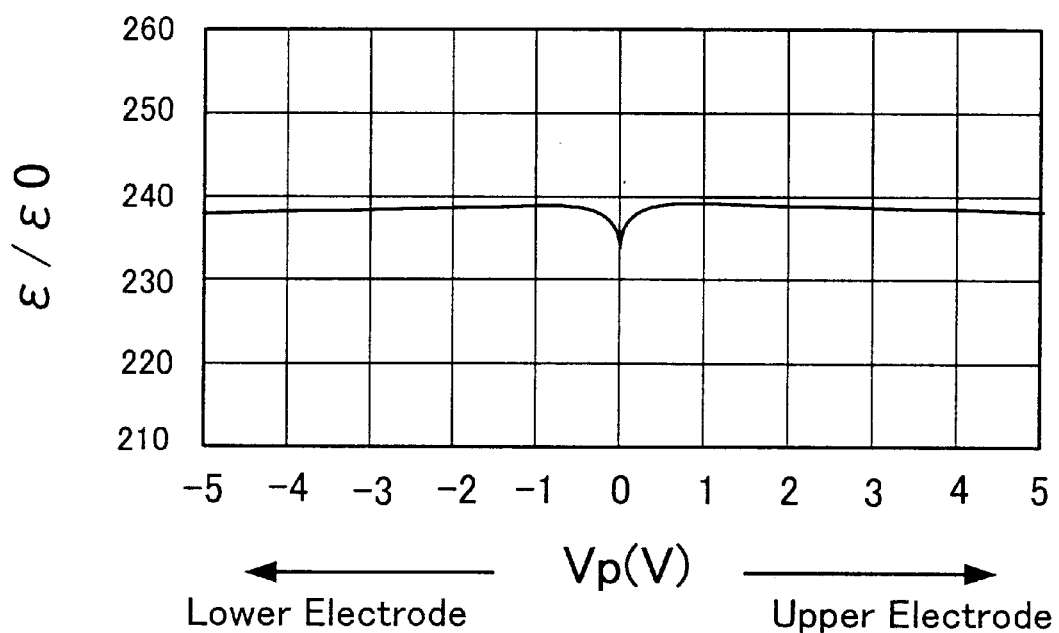
FIG. 6 is a graph showing another characteristic of the memory cell of the first preferred embodiment.

FIGS. 5 and 6 show characteristics of the memory cell 20 of the first preferred embodiment. According to the first preferred embodiment, leak current characteristic (I-V characteristic), shown in FIG. 5, and paraelectrics characteristic ($\epsilon$-V characteristic), shown in FIG. 6, are symmetrical.

Figure 7:
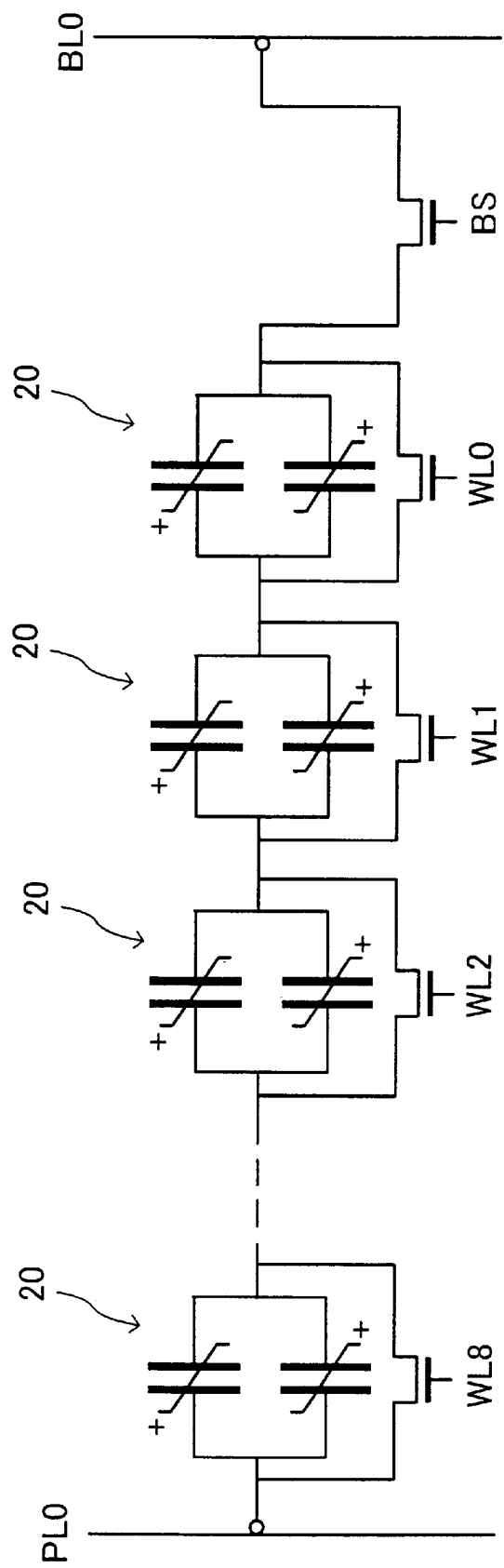
FIG. 7 is a circuit diagram illustrating a chain FRAM (Ferroelectric Random Access Memory) according to the present invention.

FIG. 7 is a circuit diagram illustrating a chain FRAM according to the present invention. The chain FRAM includes a plurality of memory cell 20 connected serially between a bit line BL0 and plate line PL0.

Figure 8:
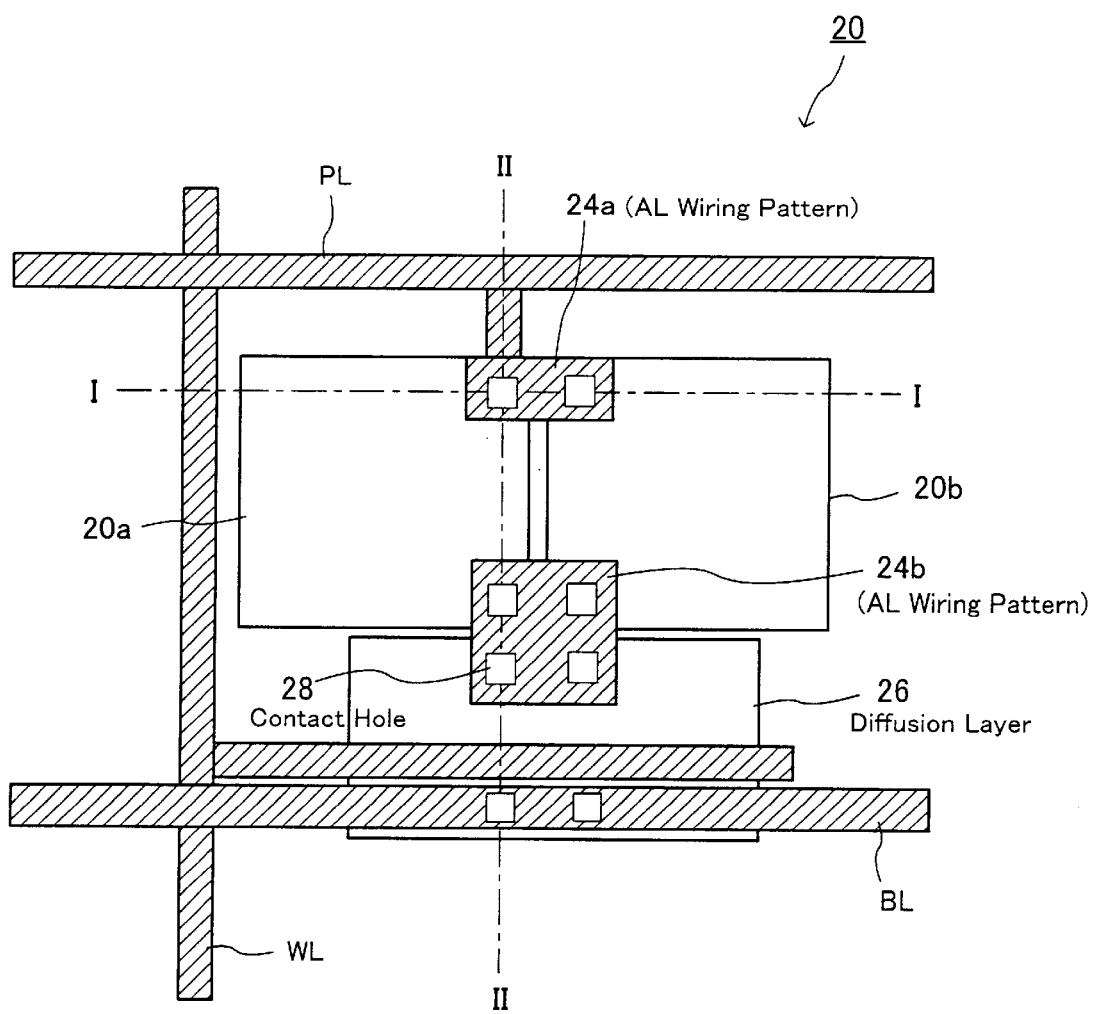
FIG. 8 is a plan view illustrating the ferroelectric memory cell of the first preferred embodiment.
Figure 9:
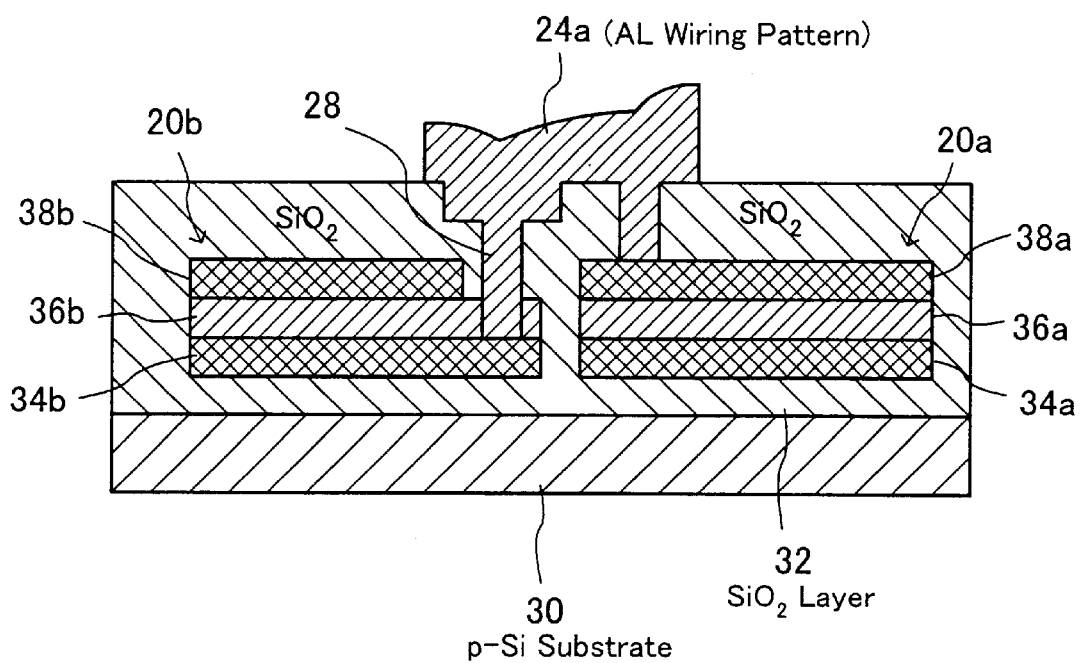
FIG. 9 is a cross-sectional view taken on line I—I in FIG. 8.
Figure 10:
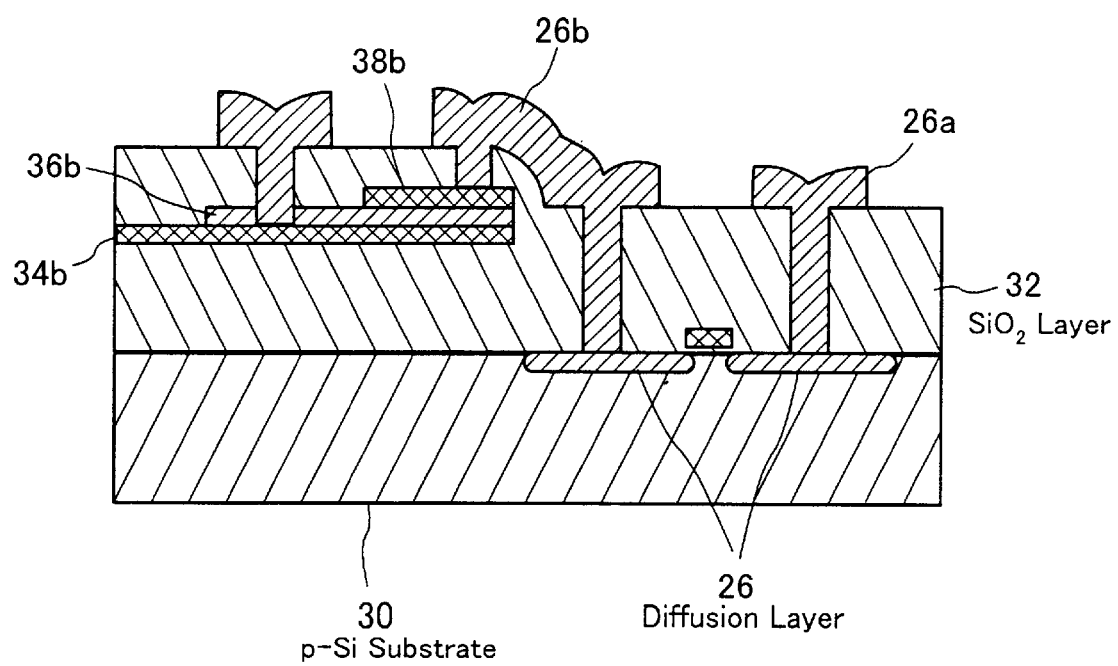
FIG. 10 is a cross-sectional view taken on line II—II in FIG. 8.

FIG. 8 is a plan view illustrating the ferroelectric memory cell 20 of the first preferred embodiment. FIG. 9 is a cross-sectional view taken on line I—I in FIG. 8. FIG. 10 is a cross-sectional view taken on line II—II in FIG. 8. In fabrication, first, a $SiO_2$ layer 32 is formed on a p-Si substrate 30, then lower electrodes 34a and 34b for first and second ferroelectric capacitors 20a and 20b are formed on the $SiO_2$ layer 32. Next, ferroelectric layers 36a and 36b for the first and second ferroelectric capacitors 20a and 20b are formed on the first electrodes 34a and 34b, respectively.

Subsequently, upper electrodes 38a and 38b for first and second ferroelectric capacitors 20a and 20b are formed on the ferroelectric layers 36a and 36b, respectively. Next, another $SiO_2$ layer is formed on the upper electrodes 38a and 38b. After that, contact hole 28 is formed through the $SiO_2$ layer and the ferroelectric layer 36b, and then, the upper electrode 38a of the first ferroelectric capacitor 20a and the lower electrode 34b of the second ferroelectric capacitor 20b are connected to each other by an aluminum wiring pattern 24a.

A diffusion layer is formed on the p-Si substrate 30 and is connected to the upper electrode 38b of the second ferroelectric capacitor 20b by an aluminum wiring pattern 26b.

Figure 11:
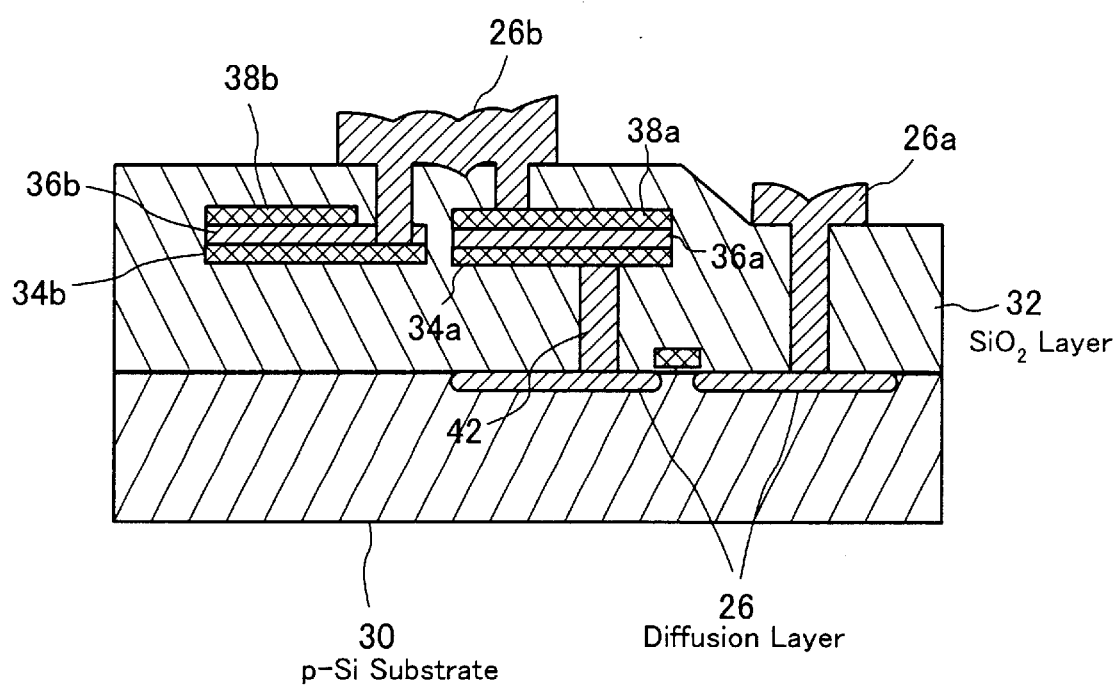
FIG. 11 is a cross-sectional view showing a ferroelectric memory cell according to a second preferred embodiment of the present invention.

FIG. 11 is a cross-sectional view showing a ferroelectric memory cell according to a second preferred embodiment of the present invention. In the second embodiment, the same and corresponding elements to those in the first preferred embodiment are represented by the same reference numerals and the same description is not repeated to avoid redundant explanation. In this embodiment, a lower electrode 34a of the first ferroelectric capacitor 20a is connected to a diffusion layer 26 by a contact plug, which is of poly-Si.

Figure 12:
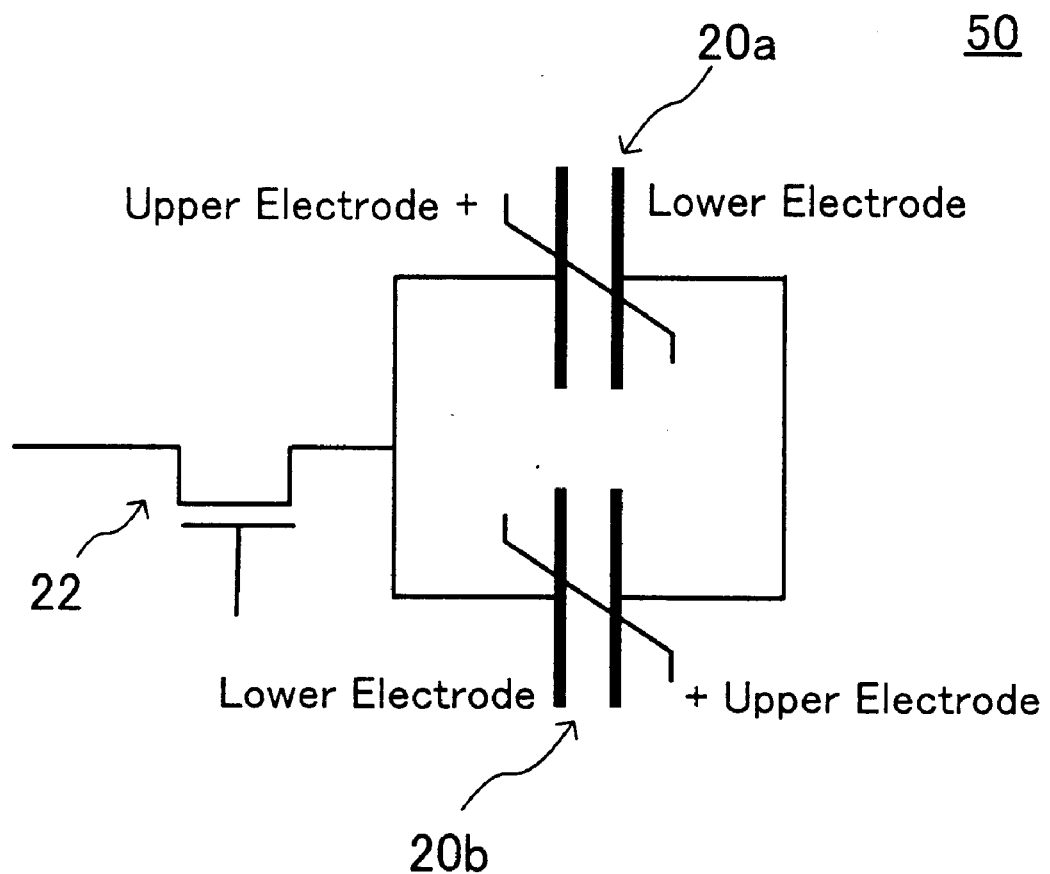
FIG. 12 is a circuit diagram illustrating a memory cell according to a third preferred embodiment of the present invention.

FIG. 12 is a circuit diagram illustrating a memory cell 50 according to a third preferred embodiment of the present invention. In the third embodiment, the same and corresponding elements to those in the first preferred embodiment are represented by the same reference numerals and the same description is not repeated to avoid redundant explanation. In this embodiment, first and second ferroelectric capacitors 20a and 20b are connected in series relative to a FET 22. In other words, an upper electrode of the first ferroelectric capacitor 20a and a lower electrode of the second ferroelectric capacitor 20b are connected to one of source and drain of the FET 22.

According to the present invention, high-$\kappa$ material (high-$\epsilon$ material), such as BST, can be used instead of ferroelectric material used in the above-described embodiments. In addition, a capacitor used in the present invention may be used as a decoupling capacitor in a high-frequency network.

What is claimed is:

1. A chain RAM, comprising:
   a bit line;
   a plate line;
   a memory cell array having a plurality of memory cells connected in series between the bit line and plate line, wherein each memory cell comprises:

(1) a first ferroelectric capacitor having upper and lower electrodes, between which a ferroelectric layer is provided;

(2) a second ferroelectric capacitor having upper and lower electrodes, between which a ferroelectric layer is provided; and (3) a transistor connected to the upper and lower electrodes of the first and second ferroelectric capacitors, wherein the upper electrode of the first ferroelectric capacitor is connected to the lower electrode of the second ferroelectric capacitor, and the lower electrode of the first ferroelectric capacitor is connected to the upper electrode of the second ferroelectric capacitor in a complimentary manner.

2. A chain RAM according to claim 1, wherein the first and second ferroelectric capacitors are connected in parallel relative to the transistor.

3. A chain RAM according to claim 1, wherein the first and second ferroelectric capacitors are connected in series relative to the transistor.

4. A chain RAM, comprising:

a bit line;

a plate line;

a memory cell array having a plurality of memory cells connected in series between the bit line and plate line, wherein each memory cell comprises:

(1) a first high-κ (high-permittivity) capacitor having upper and lower electrodes, between which a high-κ layer is provided;

(2) a second high-κ capacitor having upper and lower electrodes, between which a high-κ layer is provided; and (3) a transistor connected to the upper and lower electrodes of the first and second high-κ capacitors, wherein the upper electrode of the first high-κ capacitor is connected to the lower electrode of the second high-κ capacitor, and the lower electrode of the first high-κ capacitor is connected to the upper electrode of the second high-κ capacitor in a complimentary manner.

5. A chain RAM according to claim 4, wherein the first and second high-κ capacitors are connected in parallel relative to the transistor.

6. A chain RAM according to claim 4, wherein the first and second high-κ capacitors are connected in series relative to the transistor.

7. A method for fabricating a chain RAM according to claim 1, comprising:

providing a semiconductor substrate;

providing an insulating layer on the semiconductor substrate;

providing lower electrodes of first and second ferroelectric capacitors on the insulating layer;

providing ferroelectric layers on the lower electrodes of the first and second ferroelectric capacitors;

providing upper electrodes on the ferroelectric layers of the first and second ferroelectric capacitors;

connecting the lower electrode of the first ferroelectric capacitor to the upper electrode of the second ferroelectric capacitor, and connecting the upper electrode of the first ferroelectric capacitor to the lower electrode of the second ferroelectric capacitor in a complimentary manner.

8. A method according to claim 7, wherein the electrodes of the first and second ferroelectric capacitors are connected through contact holes.

9. A method for fabricating a chain RAM according to claim 4, comprising:

providing a semiconductor substrate;

providing an insulating layer on the semiconductor substrate;

providing lower electrodes of first and second high-κ capacitors on the insulating layer;

providing high-κ layers on the lower electrodes of the first and second high-κ capacitors;

providing upper electrodes on the high-κ layers of the first and second high-κ capacitors;

connecting the lower electrode of the first high-κ capacitor to the upper electrode of the second high-κ capacitor, and connecting the upper electrode of the first high-κ capacitor to the lower electrode of the second high-κ capacitor in a complimentary manner.

10. A method according to claim 9, wherein the electrodes of the first and second high-κ capacitors are connected through contact holes.

* * * * *